United States Patent [19]
Katzenstein

[11] Patent Number: 5,111,204
[45] Date of Patent: May 5, 1992

[54] APPARATUS FOR CONVERTING DATA BETWEEN DIGITAL AND ANALOG VALUES

[75] Inventor: Henry S. Katzenstein, Pacific Palisades, Calif.

[73] Assignee: Brooktree Corporation, San Diego, Calif.

[21] Appl. No.: 512,757

[22] Filed: Jul. 16, 1990

Related U.S. Application Data

[63] Continuation of Ser. No. 936,756, Dec. 2, 1986, abandoned, which is a continuation of Ser. No. 553,041, Nov. 18, 1983, abandoned.

[51] Int. Cl.⁵ .............................................. H03M 1/66
[52] U.S. Cl. ..................................... 341/150; 341/144
[58] Field of Search ............... 341/172, 144, 145, 148, 341/150, 152, 153, 154, 139, 155, 156, 159, 166

[56] References Cited

U.S. PATENT DOCUMENTS

| | | | |
|---|---|---|---|
| 4,028,694 | 6/1977 | Cook et al. | 341/155 |
| 4,337,459 | 6/1982 | Takahasi et al. | 341/144 |
| 4,857,929 | 8/1989 | Katzenstein | 341/148 |

OTHER PUBLICATIONS

Danielsson, P. E., "Glitch-Free D/A Converter", 1979, Digital Processes pp. 133-140, May 1979.

*Primary Examiner*—A. D. Pellinen
*Assistant Examiner*—Brian K. Young
*Attorney, Agent, or Firm*—Ellsworth R. Roston; Charles H. Schwartz

[57] ABSTRACT

Apparatus converts into an analog value signals representing digital values. Sub-sets of switches are provided, the number of switches in each sub-set being directly related to the digital significance of the switches in such sub-set. The switches in each sub-set may be paired to provide for a conductivity of one switch in each pair. The signals representing individual digital values are introduced to the associated sub-sets to provide for the conductivity of an individual one of the switches in each pair in accordance with the digital value represented by such signals. The switches are connected in a recursive relationship defined by repetitions of a basic block. Each basic block is in turn defined by a pair of basic sub-blocks. A plurality of capacitors are also provided as output members. The capacitors are connected to the recursive relationship of the switches to charge the capacitors through paths defined by the conductive ones of the switches. When the capacitors are conductive, the switches operate to introduce the charge from the capacitors to one of two output lines. For progressive increases in the digital value, a progressive number of the capacitors are connected to a particular one of the output lines, and capacitors previously connected to the particular output line are maintained connected to the output line with such progressive increases in the digital value. The cumulative current through the particular output line is indicative of the analog value.

32 Claims, 6 Drawing Sheets

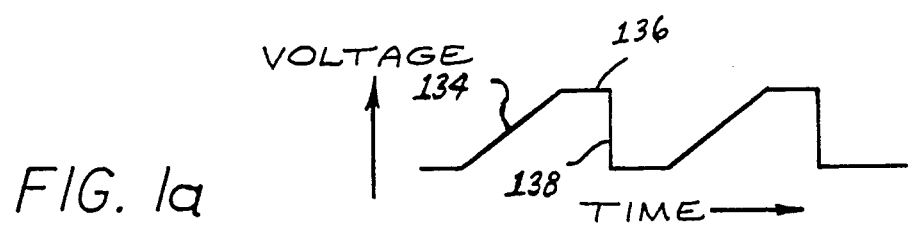
FIG. 1a
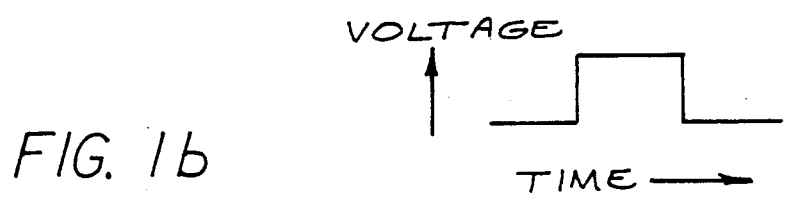
FIG. 1b
FIG. 2
| "1" | "2" | "4" | 140 | 142 | | X | | | | I |
|---|---|---|---|---|---|---|---|---|---|---|
| 0 | 0 | 0 | H | D | F | B | G | C | E | H |
| 1 | 0 | 0 | H | D | F | B | G | C | E | D |
| 0 | 1 | 0 | H | D | F | B | G | C | E | F |
| 1 | 1 | 0 | H | D | F | B | G | C | E | B |
| 0 | 0 | 1 | H | D | F | B | G | C | E | G |
| 1 | 0 | 1 | H | D | F | B | G | C | E | C |
| 0 | 1 | 1 | H | D | F | B | G | C | E | E |
| 1 | 1 | 1 | H | D | F | B | G | C | E | A |
O

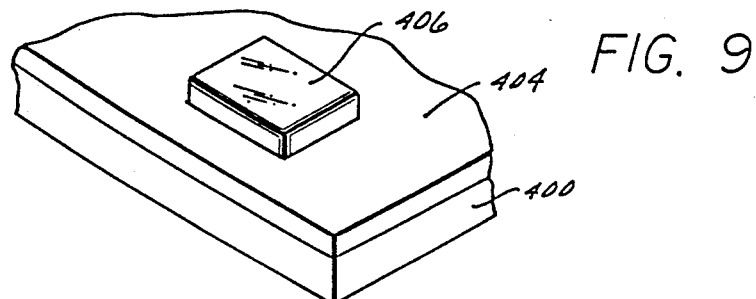
FIG. 9
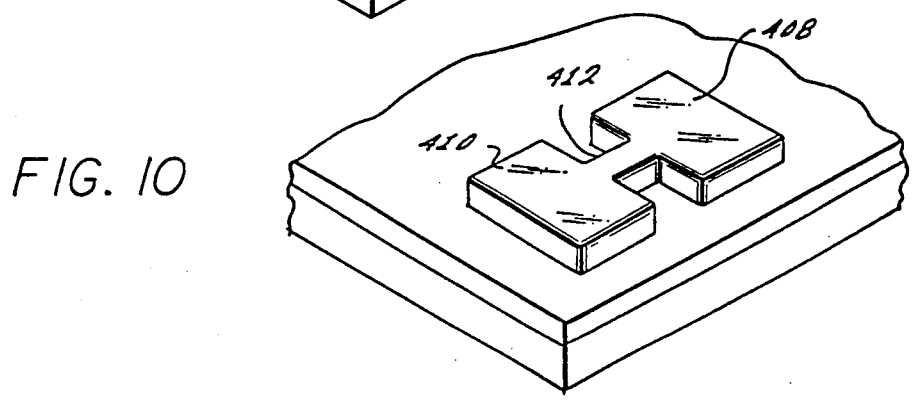
FIG. 10
FIG. 11
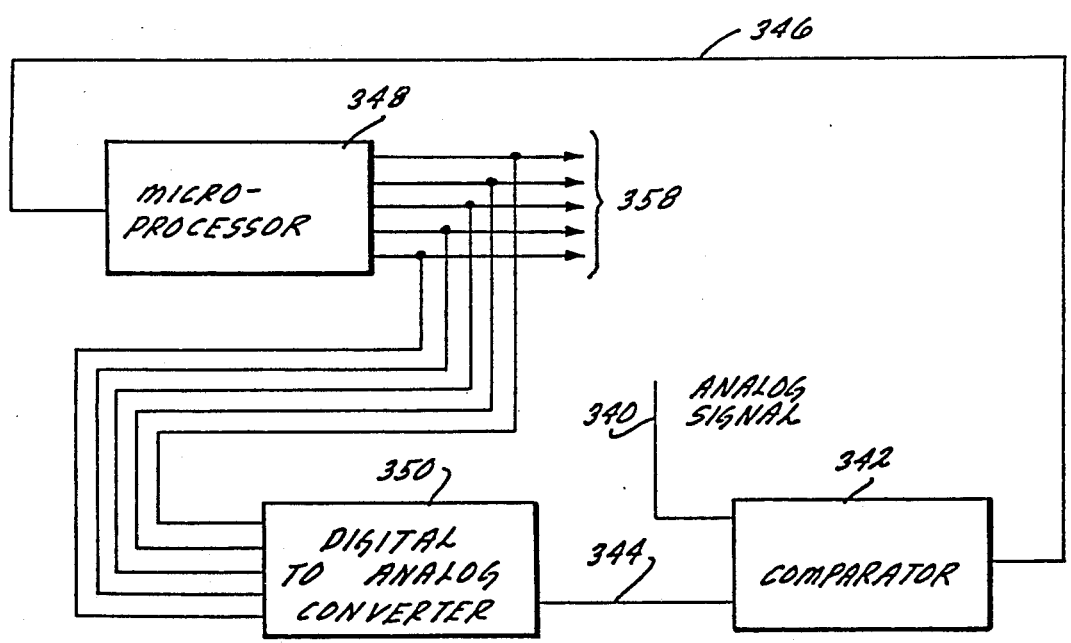

APPARATUS FOR CONVERTING DATA BETWEEN DIGITAL AND ANALOG VALUES

This is a continuation of application Ser. No. 936,756 filed Dec. 2, 1986, now abandoned, which in turn is a continuation of application Ser. No. 553,041 filed Nov. 18, 1983, now abandoned.

This invention relates to apparatus for converting data between a digital form and an analog form. More particularly, the invention relates to apparatus which provides such conversion instantaneously and on a monotonic basis and in a simple and reliable manner. The converter of this invention is particularly adapted to be disposed on an integrated circuit chip so that an optimal number of digits can be converted from a digital value to an analog value on a chip of minimal size.

Various types of equipment receive information in analog form. Such equipment includes process control equipment, measuring instruments, communication equipment and a wide variety of other equipment. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

A good example of the conversions discussed in the previous paragraph is in the recording and reproduction of music. The music is produced in analog form. It is converted to digital form by recently developed data processing techniques and is recorded on a medium such as a tape or a disc. When the music is to be reproduced, it is converted again to analog form because this is the form which is necessary to operate sound transducers to give meaning to the listener when he hears the music.

As digital computers and data processing equipment have become widespread throughout industry and the office and have even become common in the home, the need for inexpensive, simple and reliable apparatus for converting information between analog and digital forms has become of increasing concern. A considerable effort has been devoted over a period of several decades to provide for converting apparatus which is simple, inexpensive and reliable. In spite of such efforts, the converting apparatus now in use does not meet such criteria.

The converting apparatus now in use also has other problems of long-standing. For example, the converting apparatus now in use may not be monotonic unless it is quite expensive and complex. By "monotonic" is meant that digital information of progressively increasing value is converted to analog information of progressively increasing value without any decrease in the analog value as the digital value progressively increases. The converting apparatus now in use also has relatively high differential and integral non-linearities unless the apparatus is quite expensive and complex. Integral non-linearities result from errors produced in a conversion between analog and digital values over a wide range of such values. Differential non-linearities result from errors produced in a conversion between analog and digital values over a relatively narrow range of such values.

The converting apparatus now in general use also has a problem of major proportions. This results when particular digital values are increased incrementally by a single digit. For example, problems in the converters now in use result when a binary representation of "511" is converted to a binary representation of "512". This results from the fact that the binary representation of "511" is represented by a value of 0111111111 and a binary representation of "512" is represented by 1000000000 where the least significant digit is at the right. As will be seen, the value of each binary digit changes when the decimal value changes from "511" to "512". As the binary values change from 0111111111 to 1000000000, discontinuities may occur because there is a change between a binary value of "0" and a binary value of "1" at each digital position. These discontinuities may prevent the converter from being truly monotonic. This problem even exists in converters which are made quite complex in an attempt to overcome the problem.

In copending application Ser. No. 383,544 filed by me on Jun. 1, 1982, for "Apparatus for Converting Data Between Analog and Digital Values" now abandoned and assigned of record to the assignee of record of this application, apparatus is disclosed and claimed for converting between analog and digital values on a monotonic basis. Such apparatus is simple and inexpensive and reliable. It is able to operate with a high precision at high levels of power. As a result, the converting apparatus is capable of being used in areas not available for the converters of the prior art. For example, such apparatus is able to convert oral information in analog form into information in digital form and to convert the digital information back to the oral information in analog form by serving both as a converter and a amplifier.

The apparatus disclosed and claimed in application Ser. No. 383,544 also has other advantages of some importance. For example, it provides analog values of progressively increasing value as the digital value to be converted increases. It provides low differential and integral non-linearities. It is also free of the effects of aging and changes in temperature. It also provides accurate and reliable conversions between analog and digital values at high frequencies with minimal error. The converter is also able to provide an instantaneous conversion between analog and digital values and to provide a monotonic operation even while providing minimal integral and differential non-linearities. The converter is also quite simple in construction and is reliable in operation.

In the converter disclosed and claimed in application Ser. No. 383,544, apparatus is provided for converting between analog and digital values. The apparatus includes means for providing a plurality of signals representing the digital values. Sub-sets of control switches are also provided, the number of control switches in each sub-set being directly related to the digital significance of the control switches in such sub-set. The control switches in each sub-set may be paired to provide for a conductivity of one switch in each pair. The signals representing individual digital values are introduced to the associated sub-sets to provide for the conductivity of an individual one of the control switches in each pair in accordance with the digital value represented by such signals.

A plurality of output members are also provided in the converter disclosed and claimed in application Ser. No. 383,544. The output members are preferably transistors. The control switches are connected to the output members in a recursive relationship defined by repetitions of a basic block. Each basic block is in turn defined by a pair of basic sub-blocks. The sub-sets of control switches are connected in the recursive relationship to define a particular matrix for providing paths through the conductive ones of the control switches. Since the output members are conductive, the control switches operate to introduce the current through the output members to one of two output lines. For progressive increases in the digital value, a progressive number of the output members are connected to a particular one of the output lines, and output members previously connected to the particular output line are maintained connected to the output line with such progressive increases in the digital value. The cumulative current through the output members connected to the particular output line is indicative of the analog value.

When the converter of application Ser. No. 383,544 is to be used to convert audio information in digital form to audio information in analog form, at least fourteen (14), and preferably sixteen (16), bits of information generally have to be provided. Furthermore, it is preferred that this information be provided on an integrated circuit chip having a relatively small size. Before the provision of the converters of this invention, it has been difficult, if not impossible, to provide a converter with the features described in this paragraph.

This invention provides an improvement in the converter of application Ser.. No. 383,544 to meet the objectives discussed in the previous paragraph. The improved converter of this invention includes control switches connected in the same recursive relationship as in the converter of application Ser. No. 383,544 to define a matrix. However, capacitors are connected as output members in the converter of this invention.

By using capacitors as output members in the converter of this invention, the response time of the converter is considerably slowed in comparison to the converter of application Ser. No. 383,544. This does not constitute a disadvantage when the converter of this invention is used in audio applications since the response time of the converter of this application is still considerably faster than the sampling interval which is produced when the audio information is sampled at a rate of approximately forty-four (44) kilocycles per second.

Capacitors are also advantageous as the output members because they can be easily formed on an integrated circuit chip and can be duplicated so that there are minimal errors in value between the different capacitors on the chip. For example, the capacitors can be provided on the chip with deviations in value as low as one tenth of one percent (0.1%). This is even true when the capacitors are disposed at the extremities of the chip. The use of capacitors as the output members is also advantageous since any need for additional stages such as operational or reference amplifiers is eliminated.

The use of capacitors as output members also provides other important advantages. For example, the capacitors are stable from a temperature standpoint. Furthermore, if there are any changes in temperature, all of the capacitors are affected substantially the same so that there is no change in the overall operation of the converter. The capacitors are also advantageous in the sense that there is not if very little, energy loss in the capacitors.

In the drawings:

FIG. 1a is a schematic diagram illustrating the time relationship of the charging and discharging of capacitors in the embodiment shown in FIG. 1;

FIG. 1b is a schematic diagram illustrating the time relationship of a reset signal introduced to one of the transistors in the embodiment shown in FIG. 1 to discharge the capacitors for instituting a new indication of the analog value.

FIG. 2 is a truth table illustrating the operation of the system shown in FIG. 1;

FIG. 9 is a schematic diagram illustrating the construction on the integrated circuit chip of the capacitors which are used as the current sources;

FIG. 10 is a schematic diagram illustrating the construction of capacitors of different values on the integrated circuit chip; and FIG. 11 is a block diagram showing an analog-to-digital converter which incorporates the apparatus of FIG. 1.

Figure 1:
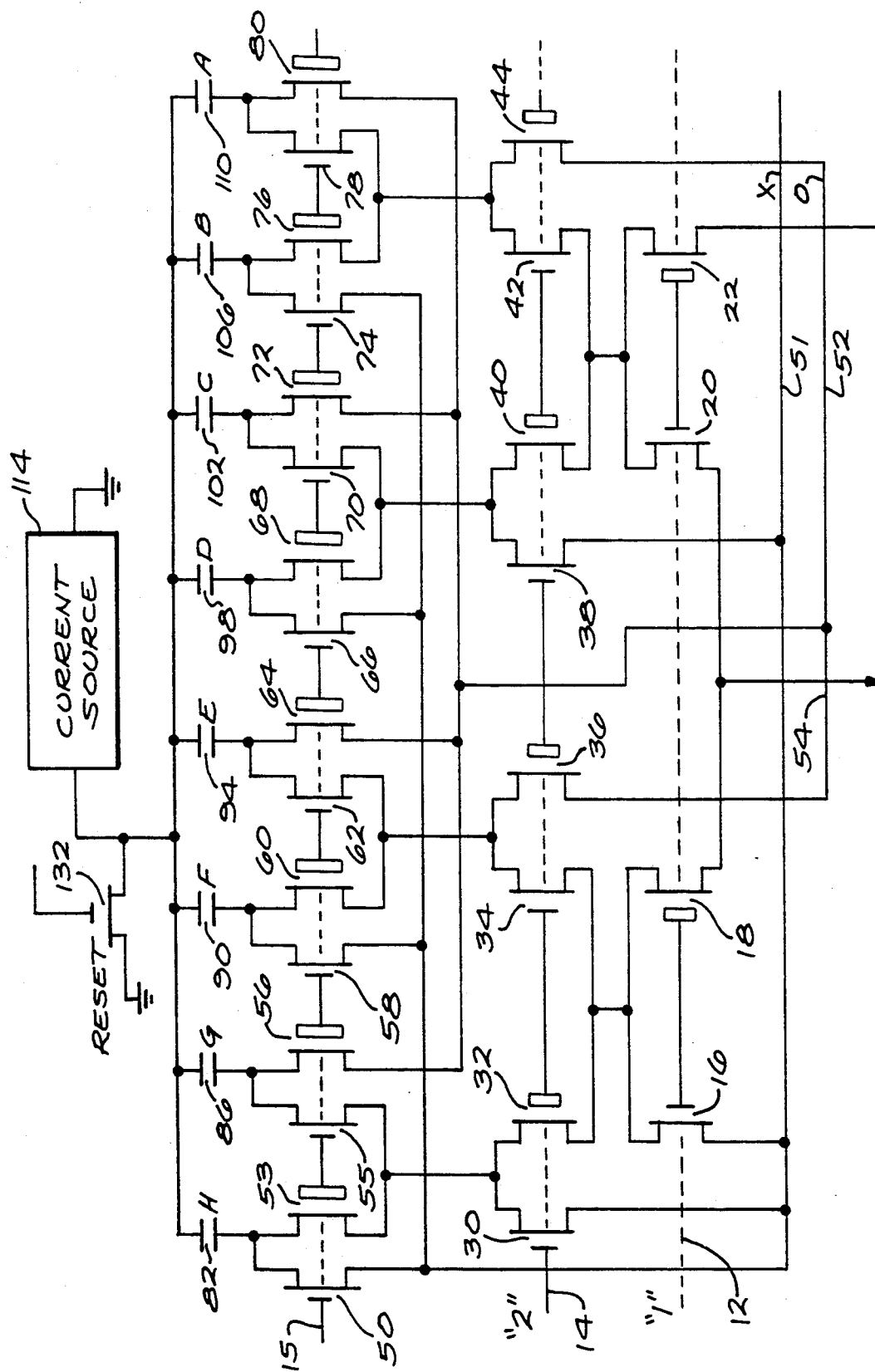
FIG. 1 is a schematic circuit diagram of one embodiment of the invention, this embodiment including capacitors as current sources and this embodiment having preferable application to digital audio systems.

In the embodiment of the invention shown in FIG. 1, a digital-to-analog converter generally indicated at 10 is provided. The converter 10 receives digital signals on a plurality of input lines 12, 14 and 15. The signals on the lines preferably represent information in binary form. For example, the signals on the line 12 may represent a binary value of "1" and the signal on the lines 14 and 15 may respectively represent binary values of "$2^1$" and "$2^2$". Illustratively, a binary "1" may be represented by a signal of high amplitude and a binary "0" may be represented by a signal of low amplitude. Although only three (3) digits are shown, it will be appreciated that any particular number of digits may be used.

In the embodiment shown in FIG. 1, the line 12 is connected to the gates of transistors 16, 18, 20 and 22. The transistors 16, 18, 20 and 22 may constitute field effect transistors, particularly MOS field effect transistors, or may constitute any other suitable type of control transistor. The transistors 16 and 20 may particularly comprise N-channel field effect transistors and the transistors 18 and 22 may comprise P-channel field effect transistors.

Similarly, the line 14 is connected to the gates of transistors 30, 32, 34, 36, 38, 40, 42 and 44. As with the transistors 16, 18, 20 and 22, the transistors 30 through 44 (even numbers only) may constitute field effect transistors or any other suitable type of transistor. When field effect transistors are used, the transistors 30, 34, 38 and 42 may constitute N-channel field effect transistors and the transistors 32, 36, 40 and 44 may constitute P-channel effect transistors.

The sources of the N-channel transistors 16, 30 and 38 are connected to an output line 51 and the sources of the P-channel transistors 22, 36 and 44 are connected to an output line 52. A connection is made from the source of the P-channel field effect transistor 18 and the source of the N-channel field effect transistor 20 to an interpolation line 54. The drains of the transistors 16 and 18 are common with the sources of the transistors 32 and 34. Similarly, the drains of the transistors 20 and 22 and the sources of the transistors 40 and 42 have a common terminal.

Gates of transistors 50, 53, 55, 56, 58, 60, 62, 64, 66, 68, 70, 72, 74, 76, 78 and 80 receive the signals on the line 15. Connections are respectively made from the drains of the transistors 30 and 32, the transistors 34 and 36, the transistors 38 and 40 and the transistors 42 and 44 to the sources of the transistors 53 and 55, the transistors 60 and 62, the transistors 68 and 70 and the transistors 76 and 78. The transistors 50, 55, 58, 62, 66, 70, 74 and 78 may be N-channel field effect transistors and the transistors 53, 56, 60, 64, 68, 72, 76 and 80 may be P-channel field effect transistors.

The drains of the transistors 50 and 53, the transistors 55 and 56, the transistors 58 and 60, the transistors 62 and 64, the transistors 66 and 68, the transistors 70 and 72, the transistors 74 and 76 and the transistors 78 and 80 may be respectively connected to first plates of capacitors 82, 86, 90, 94, 98, 102, 106 and 110. Second plates of the capacitors are connected to a current source 114, which is preferably constructed to provide a constant current.

The capacitors 82, 86, 90, 94, 98, 102, 106 and 110 may be provided with substantially equal and relatively low values. For example, the capacitors may be provided with values in the order of five (5) picofarads.

The sources of the transistors 50, 58, 66 and 74 have a common connection with the first output line 51 and the sources of the transistors 56, 64, 72 and 80 have a common connection with the output line 52.

The N-channel field effect transistors such as the transistor 16 are non-conductive when a signal having a relatively low voltage and representing a digital value of "0" is introduced to the bases of the transistors. The N-channel field effect transistors such as the transistor 16 become conductive when a positive voltage representing a digital value of "1" is introduced to the bases of the transistors. In contrast, the P-channel field effect transistors such as the transistor 18 are non-conductive when a positive voltage is introduced to the base of the transistor in representation of a digital value of "1". The P-channel field effect transistors become conductive when a negative voltage representing a digital value of "0" is introduced to the bases of the transistors.

The transistors shown in FIG. 1 may be considered as being paired. For example, the transistors 16 and 18 in FIG. 1 may be considered as being paired. Only one of these transistors is conductive at any instant and the other transistor is non-conductive at that instant. Similarly, the transistors 30 and 32 and the transistors 50 and 53 may be considered as paired.

The switches 16, 18, 20 and 22 may be considered as one sub-set; the switches 30 through 44 (even numbers only) may be considered as a second sub-set; and the switches 50, 53, 55 and 56 through 80 (even numbers only) may be considered as a third sub-set. All of the switches may be considered to constitute a plurality. The matrix relationship defined by these control switches may be considered to be disposed in the form of a pyramid since the number of switches in each sub-set increases for the digits of progressively increasing significance.

The control switches are connected in a recursive relationship. This results from the fact that the switches are connected in repetitions of a basic block. This block may be considered to constitute the switches 16 and 18 and the switches 30, 32, 34 and 36. The recursive relationship defined by these switches may be considered as being divided into two (2) recursive sub-blocks, one (1) recursive sub-block being provided by the switches 16, 30 and 32 and the other being provided by the switches 18, 34 and 36. The control switches may be considered as being connected in a recursive relationship because the matrix relationship defined by the control switches may be considered to be formed from repetitions of the blocks and sub-blocks.

As will be seen, the control switches 16, 18, 20, 22, the control switches 30 through 44 (even numbers only) and the control switches 50, 53, 55 and 56 through 80 (even numbers only) may be connected in the matrix relationship to one another and to the capacitors 82, 86, 90, 94, 98, 102, 106 and 110 to minimize any cross-over of leads connecting the control switches and the capacitors. This is important in minimizing stray capacitive effects in the matrix relationship. Such stray capacitive effects are undesirable since they would otherwise tend to limit the maximum frequency at which the system of FIG. 1 can operate and since they are not entirely predictable.

The operation of the circuit of FIG. 1 may be seen from specific examples. For example, for an analog value of "1" represented by a digital "1" on the line 12 and a digital "0" on the lines 14 and 15, the transistors 16 and 20 become conductive and the transistors 32, 36, 40 and 44 and the transistors 53, 56, 60, 64, 68, 72, 76 and 80 are conductive. This causes a capacitive-discharge current to flow through a circuit including the current source 114, the capacitor 86, the control transistor 53, the control transistor 32 and the transistor 16 to the output line 51 to indicate an analog value of "1". At the same time, a capacitive-discharge current flows through a circuit including the current source 114, the capacitor 98, the transistor 68, the transistor 40, the transistor 20 and the interpolation line 54. The capacitive-discharge currents through all of the other capacitors are introduced to the line 52. Since only the capacitive-discharge current in the line 51 is effective in indicating the analog value represented by the digital signals, an analog value of "1" is indicated by the current on the line 51. The currents are designated as "capacitive-discharge" since the discharge of capacitances such as in the circuits described above for the digital value of "1" may be considered to provide currents.

The transistors 30, 34, 38 and 42, the transistors 18 and 22 and the transistors 53, 56, 60, 64, 68, 72, 76 and 80 become conductive for an analog value of "2". When this occurs, the capacitor 84 passes a capacitive-discharge current to the line 51 through the transistors 53 and 30 and the capacitor 98 passes a capacitive-discharge current to the line 51 through the transistors 68 and 38. The capacitor 90 passes a capacitive-discharge current to the interpolation line 54 through a circuit including the current source 114, the capacitor 90, the transistors 60 and 34, the transistor 18 and the interpolation line. All of the other capacitors pass a capacitive-discharge current to the line 52. In this way, the output line 51 receives a capacitive-discharge current from two (2) of the output members, corresponding to the analog value of "2".

FIG. 1 also includes a gating switch which may constitute a field effect transistor 132. One terminal, such as the source, of the transistor may be connected to a reference voltage such as ground. A second terminal, such as the gate, of the transistor 132 may receive a periodic signal. For example, when audio information is being converted, the gating signal may be provided at a sampling rate such as approximately forty-four kilohertz (44 Khz). A third electrode, such as the drain, of the transistor 132 may be connected to the current source 114 and the capacitor 82, 86, 90, 94, 98, 102, 106 and 110.

The transistor 132 is normally non-conductive. During the time that the transistor 132 is non-conductive, the digital signals on the lines 12, 14 and 15 in FIG. 1 produce a pattern of operation in the matrix arrangement in FIG. 1 so that the capacitors 82, 86, 90, 94, 98, 102, 106 and 110 become charged by a flow of current through the output line 51. This is illustrated at 134 in FIG. 1a. The capacitors become fully charged in a relatively short period of time by this flow of current because of their relatively low value. The completion of such charging is illustrated at 136 in FIG. 1a.

The capacitive charge current through the output line 51 has a value directly representative of the number of the capacitors connected to the line. The amplitude of this charge represents in analog form the digital value of the signals introduced to the lines 12, 14 and 15.

The current flowing through each of the capacitors 82, 86, 90, 94, 98, 102, 106 and 110 has a relatively low value. For example, when the voltage from the source 114 has a value such as five volts (5v) and each of the capacitors has a value of approximately five picofarads (5pf), the current through each capacitor may have a value such as a few microamperes. For example, the current through each of the capacitors may be approximately five microamperes (5ua).

FIG. 2 provides a table indicating the states of operation of the different digital values represented by the signals on the lines 12, 14 and 15. As will be seen, the first three columns of FIG. 2 respectively represent the binary values of the signals on the lines 12, 14 and 15. These binary values correspond in successive rows to analog values between "0" and "7". For example, in the third row a value of "010" indicates an analog value of "2" and, in the sixth row, a digital representation of "101" represents an analog value of "5". The next seven (7) columns represent the states of connection of the capacitors. These states of conductivity are represented by the letters "A" through "H". The letters "A" through "H" in FIG. 2 respectively correspond to the capacitors 110, 106, 102, 98, 94, 90, 86 and 82 in FIG. 1. The letters "A" through "H" are respectively disposed adjacent these capacitors in FIG. 1.

Diagonal lines 140 and 142 are shown in FIG. 2. These diagonal lines delineate the capacitors connected to the output line 51 for the different values between "0" and "7" and the capacitors connected to the output line 52 for such values. The indications to the left of the diagonal line 140 represent the capacitors connected to the output line 51 and the indications to the right of the diagonal line 142 represent the capacitors connected to the output line 52. The capacitors between the lines 140 and 142 are connected to the interpolation line 54.

The number of capacitors to the left of the line 140 for any digital value corresponds to the digital value indicated in the first three columns. For example, for a digital value of "010" corresponding to an analog value of "2", the capacitors "H" and "D" are connected to the output line 51 so that the output line indicates an analog value of "2". Similarly, for a digital value of "101" corresponding to an analog value of "5", the capacitors "H", "D", "F", "B" and "G" are connected to the output line 51 so that the line 51 indicates the analog value of "5". The current flowing through the line 51 during the period 134 in FIG. 1a indicates the analog value coding for the logic levels of the binary signals introduced to the lines 12, 14 and 15.

As will be further seen, the capacitors previously connected to the output line 51 for any digital value continue to remain connected to the output line 51 as the digital value increases. In this way, the output indication of the digital value is monotonic for any value of the count. Furthermore, by maintaining the characteristics of the different capacitors 82, 86, 90, 94, 98, 102, 106 and 110 substantially constant, the circuit shown in FIG. 1 has low differential and integral non-linearities. Similarly, the capacitors previously connected to the output line 52 for a value remain connected to the output line as the value decreases.

When the gating signal, such as that shown at 137, FIG. 1b, is periodically introduced to the gate of the transistor 132, it causes the transistor to become conductive and a low impedance to be produced between the drain and the source of the transistor so that the drain and the source of the transistor are effectively grounded. This causes the capacitors 82, 86, 90, 94, 98, 102, 106 and 110 to be discharged through the output lines 51 and 52. This discharge is instantaneous because of the low impedance in the discharging circuit. The discharge of the capacitors is illustrated at 138 in FIG. 1a.

Figure 4:
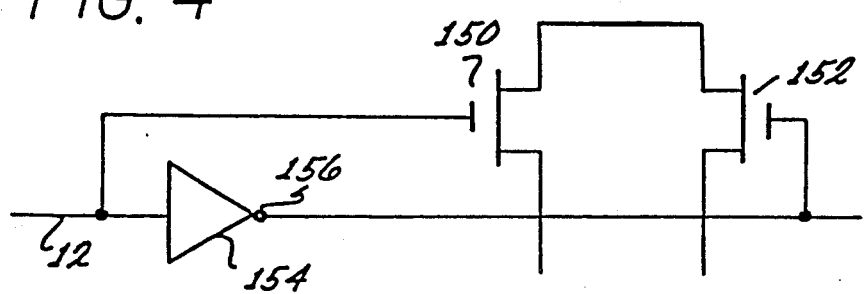
FIG. 4 is a simplified circuit diagram illustrating another transistor arrangement which can be used in the embodiment of FIG. 1.

FIG. 4 indicates an arrangement in which only one particular type of control transistor is used in circuitry corresponding to FIG. 1 rather than the two different types of transistors actually shown in FIG. 1. In the embodiment shown in FIG. 4, each pair of transistors such as the transistors 16 and 18 or the transistors 20 and 22 may be provided by N-channel field effect transistors such as transistors 150 and 152. The base of the transistor 150 is directly connected to an input line such as the line 12. The input line 12 is also connected to the input terminal of an amplifier 154 having its output terminal connected to an inverter 156. A connection is made from the output of the inverter 156 to the base of the transistor 152. The amplifier 154 and the inverter 156 may be an amplifier-inverter and may be disposed in a single package.

In the arrangement shown in FIG. 4, the transistor 150 becomes conductive in a manner similar to that described above for the transistor 16 when a signal representing a digital value of "1" is provided on the line 12. At such a time, the transistor 152 remains non-conductive because the digital value of "1" on the line 12 is inverted by the amplifier 154 and the inverter 156 to a digital value of "0". When a digital value of "0" is produced on the line 12, the transistor 150 becomes non-conductive in a manner similar to that described above for the transistor 16 in FIG. 1. At the same time, the digital value of "0" is inverted by the amplifier 154 and the inverter 156 so that a signal representing a digital value of "1" is introduced to the base of the transistor 152 to cause the transistor to become conductive.

The converter shown in FIGS. 1 has certain important advantages, particularly when the converter is formed on an integrated circuit chip. One advantage is that a converter responsive to as many as sixteen (16) binary bits can be easily formed on an integrated circuit chip as small as one tenth of an inch (0.1") square. This results in part from the fact that the capacitors 82, 86, 90, 94, 98, 102, 106 and 110 can be small. Furthermore, even though the capacitors are small, they are able to be formed with variations in value of only one tenth of one percent (0.1%). This error is so small that it cannot affect the response of each capacitor to the signals representing the binary input values of "0" and "1". This insures that proper representations are provided in the converter even for the binary bits of least digital significance.

Figure 3:
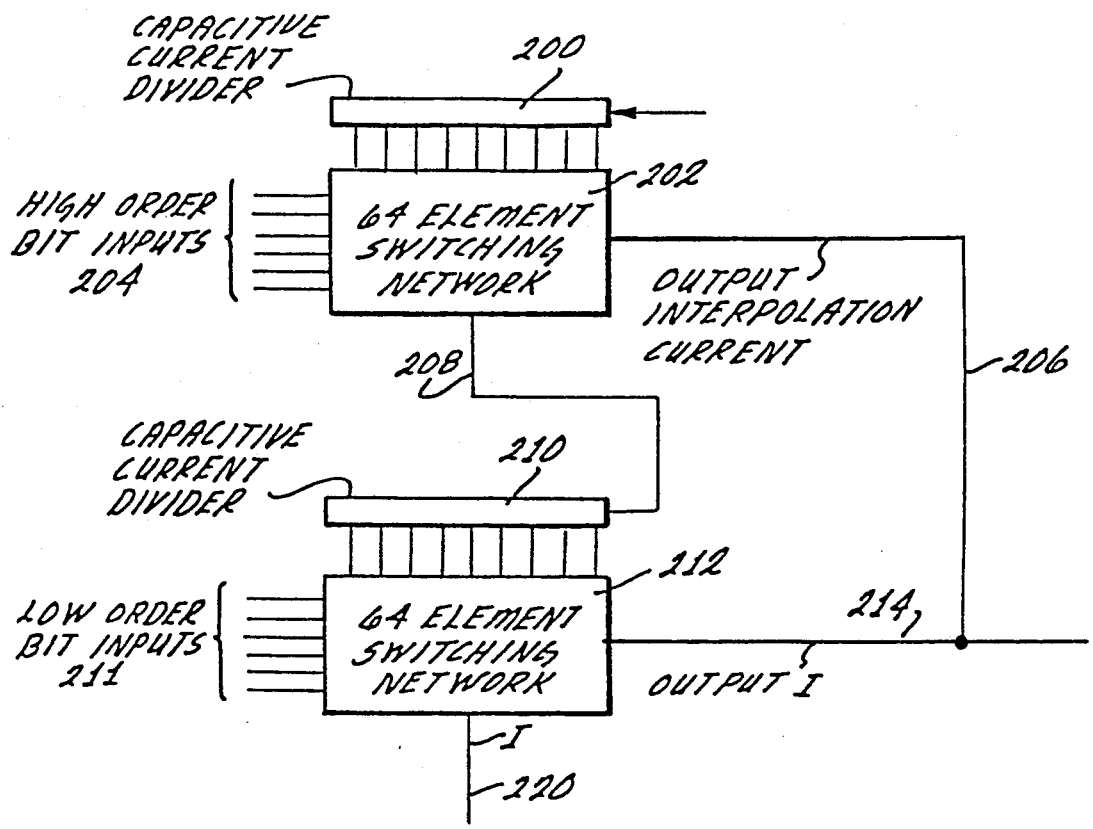
FIG. 3 is a block diagram of another embodiment of the invention, this embodiment illustrating the interconnection of more than one of the embodiments shown in FIG. 1.

FIG. 3 provides an arrangement for converting a considerable number of bits of digital information to a corresponding analog signal in a relatively simple manner. In the embodiment shown in FIG. 3, capacitors corresponding to the capacitors 82, 86, 90, 94, 98, 102, 106 and 110 in FIG. 1 are illustrated on a block basis at 200. The output members are connected in FIG. 3 to a block 202 corresponding to the matrix arrangement shown in FIG. 1. This block may receive signals representing the binary digits of greatest significance. By way of illustration, these signals are introduced to input lines indicated at 204 in FIG. 3. Six (6) input lines are illustrated in FIG. 3. These input lines correspond to lines such as the input lines 12, 14 and 15 in FIG. 1.

An output line 206 extends from the matrix arrangement 202 in FIG. 3. The output line 206 corresponds to the output line 51 in FIG. 1. An interpolation line 208 also extends from the matrix arrangement 202 in FIG. 3. The interpolation line 208 corresponds to the line 54 in FIG. 1. The interpolation line 208 in FIG. 3 is connected to a block 210 corresponding to the block 200 in FIG. 3. The block 210 includes a plurality of capacitors such as are provided for the block 200. The capacitors are in turn connected to a matrix arrangement 212 corresponding to the matrix arrangement 202 in FIG. 3. The matrix arrangement 212 receives signals of decreased digital significance on lines 211 relative to the signals introduced on the lines 204.

An output line 214 extends from the matrix arrangement 212. The output line 214 corresponds to the output line 206 from the matrix arrangement 202. The output lines 206 and 214 may be connected to an amplifier 216 corresponding to the amplifier 122 in FIG. 1. The output voltage from the amplifier 216 indicates the analog value of the digital signals introduced through the lines 204 to the matrix arrangement 202 and the corresponding digital signals introduced to the matrix arrangement 212 through the lines 211. As will be appreciated, an amplifier such as the amplifier 216 does not have to be used in the embodiment shown in FIG. 3.

An interpolation line 220 may extend from the matrix arrangement 212. The interpolation line 220 may correspond to the interpolation line 208 extending from the matrix arrangement 202. The interpolation line 220 may be connected to additional blocks (not shown) corresponding to the blocks 200 and 210. In this way, the chain arrangement shown in FIG. 3 may be extended through any number of successive sequences that the user may desire. As will be appreciated, each extension of the chain increases the accuracy in which the digital information is converted to an analog voltage.

The embodiment including the blocks 200 and 202 in FIG. 3 operates in a manner similar to that described above for the embodiment shown in FIG. 1. In addition, a capacitive-discharge current is provided on the interpolation line 208 in a manner similar to the provision of the capacitive-discharge current on the interpolation line 54 in FIG. 1. The value of this capacitive-discharge current is proportional to the number of the capacitors in the block 200 in FIG. 3. For example, when the blocks 200 and 202 are responsive to signals on three input lines such as the lines 12, 14 and 15 in FIG. 1, one eighth ($\frac{1}{8}$) of the capacitive-discharge current flowing from the voltage source through the block 200 is introduced to the interpolation line 208 in FIG. 3. This capacitive-discharge current is then divided among the capacitors in the block 210 in a manner similar to the division of the capacitive-discharge currents in the capacitors in the block 200.

In this way, the embodiment shown in FIG. 3 is able to operate to provide a conversion of a large number of digits while being constructed in a relatively simple manner. This results from the fact that the two (2) matrix arrangements for the conversion as in FIG. 3 of six (6) binary bits in a 3×3 relationship is considerably more simple than a single matrix relationship for the conversion of the six (6) binary bits.

Figure 5:
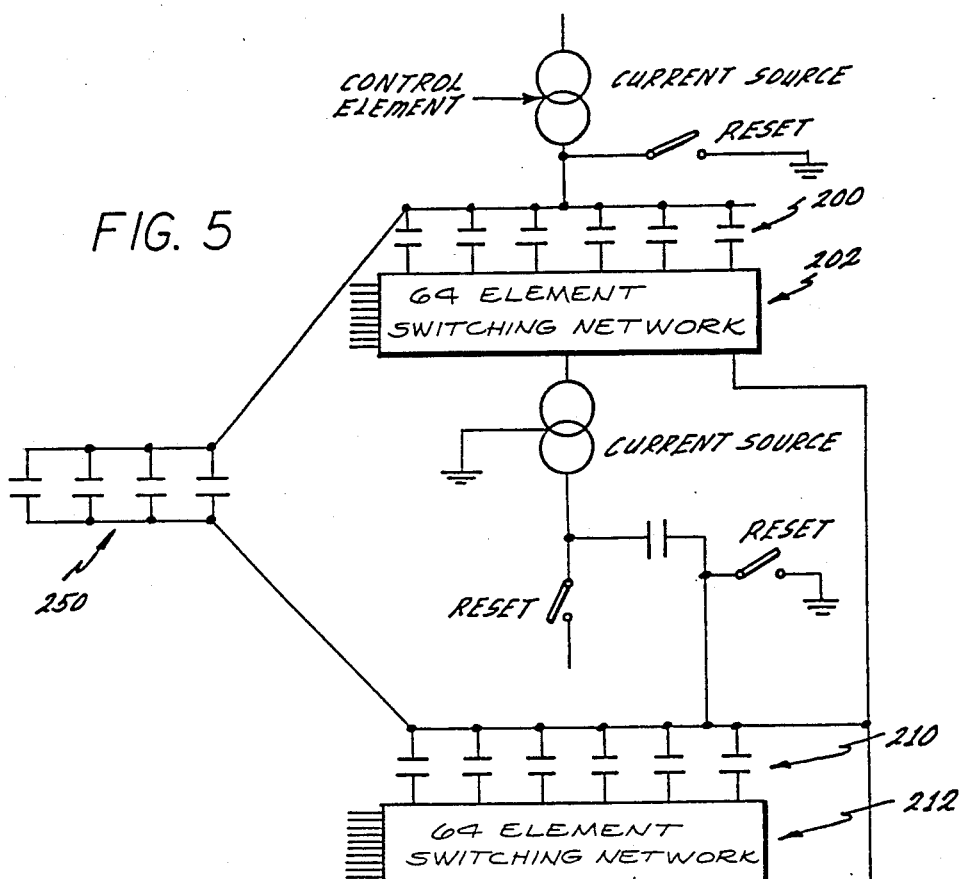
FIG. 5 is a block diagram of another embodiment of the invention, this embodiment constituting an improvement of the embodiment shown in FIG. 3.

FIG. 5 illustrates a modification of the system shown in FIG. 3. In the embodiment shown in FIG. 5, capacitors generally indicated at 250 are connected between the blocks 200 and 210 to compensate for leakage current in the matrix relationship 202. This compensation results from the fact that current flows from the current source 114 through the capacitors 250 to the block 210 to replenish in the block 210 the current lost in the block 202 as a result of leakage through stray capacitances in the block 202.

The use of capacitors in the embodiments shown in FIGS. 1, 3, 4 and 5 and described above offers certain important advantages, particularly when these embodiments are formed on integrated circuit chips. When capacitors are formed as the output members on the chips, they may have maximum deviations from desired values as low as one tenth of one percent (0.1%). This is true even though the capacitors may be formed at different positions throughout the chip. Because of these low deviations from a desired value, the converter of this invention is monotonic, even for the digit of least digital significance. The converter of this invention also has minimal differential and integral non-linearities.

The use of capacitors as the output members in the embodiments shown in FIGS. 1, 3, 4 and 5 and described above also offers other important advantages. For example, the capacitors offer minimal deviations from a temperature standpoint since all of the capacitors tend to be affected in the same manner by changes in temperature. The capacitors also tend to have minimal dissipations of energy by the flow of current through the capacitors. This is particularly true since the flow of current through the capacitors can be quite small. As a result, the converter tends to be quite stable when capacitors are used as the output members.

Furthermore, although capacitors tend to respond more slowly than other output members such as transistors, this is not of prime importance when the capacitors are used as the output members in converters for converting digital audio signals to corresponding analog signals. This results from the fact that the sampling rate for the digital audio signals is at a relatively slow rate such as approximately forty-four kilohertz (44 Khg.). At this sampling rate, the capacitors can be easily charged and discharged in each timing interval, as shown in FIG. 3 and described above.

The converters shown in FIGS. 1, 3, 4 and 5 and described above have other advantages in addition to those described above. For example, the matrix arrangement is constructed to receive directly the digital signals on the input lines such as the lines 12, 14 and 15 and to operate on such signals to provide, on the output line such as the output line 51, a current having an amplitude directly related to the analog value represented by the digital signals. In this way, the converter has a simple and straightforward construction and is still able to provide an accurate analog indication of a digital value.

By providing an arrangement in which all of the output members are capacitive and by switching progressive capacitors to an output line such as the line 51 in FIG. 1 as the digital value progressively increases, the monotonic operation of the converters shown in FIGS. 1, 3, 4 and 5 is assured. Furthermore, when the capacitors are made with precision and when a considerable number of capacitors are responsive to the operation of the matrix arrangements shown in FIG. 1, the converters operate to provide minimal differential and integral non-linearities. The monotonic operation of the converters is further assured because all of the capacitors remain continuously charged until they are connected to either one of the output lines such as the lines 51 and 52 in FIG. 1 when the switch 132 in FIG. 1 becomes conductive.

Since the capacitors previously connected to the output line such as the line 51 continue to remain connected to this line for successive switching intervals represented by sequential closings of the switch 132 in FIG. 1 and additional capacitors become connected to the output line 51 as the digital value progressively increases, no discontinuities are produced as the number being converted changes from a decimal value such as "511" to a decimal value such as "512" or from a decimal value such as "1023" to a decimal value such as "1024". This further assures that the converters of FIGS. 1, 3, 4 and 5 are monotonic.

Figure 6:
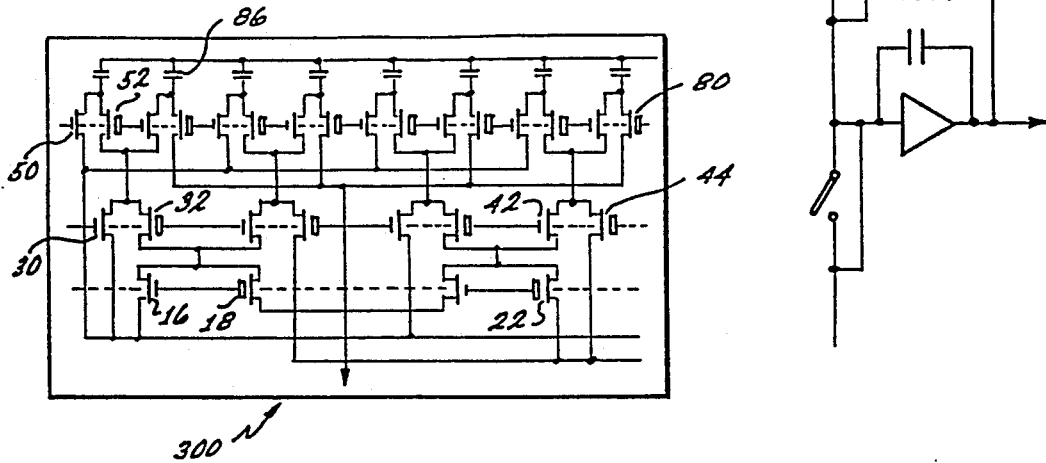
FIG. 6 is a schematic diagram of an integrated circuit chip on which the converter shown in FIG. 1 may be disposed.

The converters shown in FIGS. 1, 3, 4 and 5 described above may be incorporated on an integrated circuit chip generally indicated at 300 in FIG. 6. This is particularly true in view of the simple and straightforward construction of the particular matrix arrangement such as the matrix arrangement 202 in FIG. 3.

Such incorporation of the converter on the chip may be provided by large-scale integration (LSI) or very large scale integration (VLSI) techniques. In this way, the apparatus may be self-contained. Furthermore, since all of the transistors and capacitors are formed simultaneously and the chip is quite small, the transistors and capacitors respectively have substantially identical characteristics. This is particularly true since the chip has a surface area less than approximately one tenth inch (1/10") square. The simultaneous formation of the output devices on such a small chip tends to assure that the current on the output line, such as the output line 51 in FIG. 1, indicates accurately in analog form the digital information represented by the signals on the input lines such as the lines 12, 14 and 15 in FIG. 1.

Figure 7:
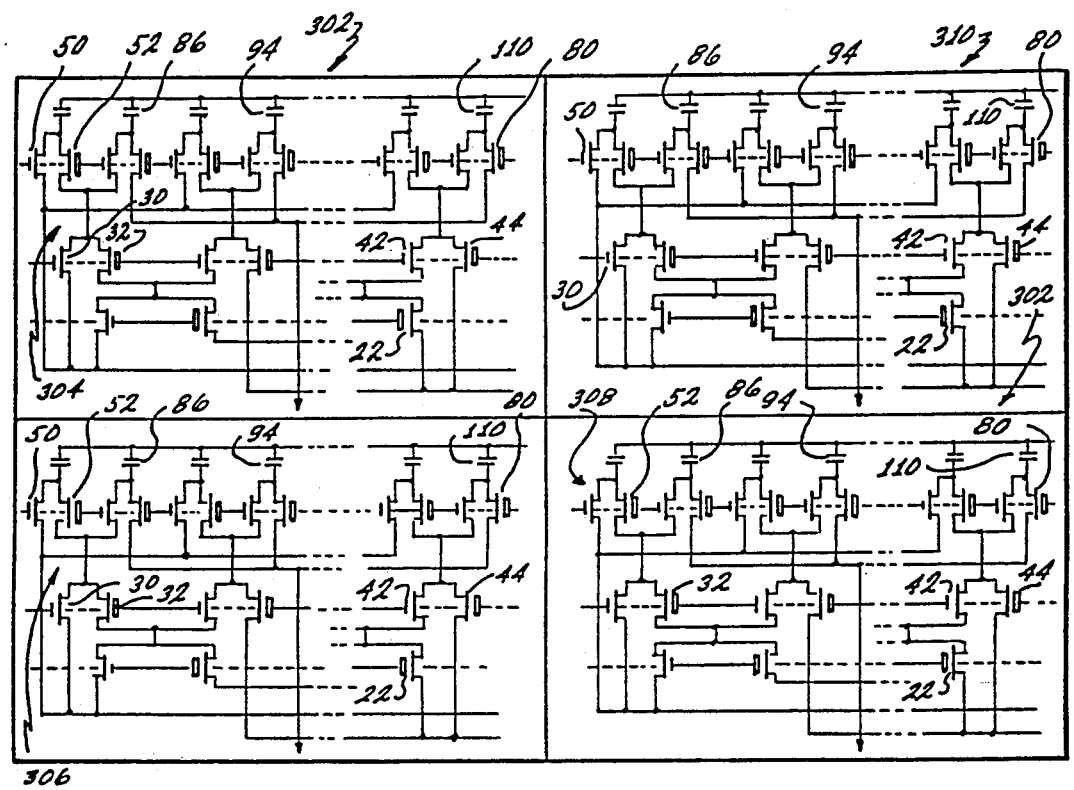
FIG. 7 is a schematic diagram of an integrated circuit chip on which a plurality of converters such as shown in FIG. 1 may be disposed in modular form.

Actually, a plurality of modules may be provided on a single chip generally indicated at 302 in FIG. 7. The modules are indicated schematically at 304, 306, 308 and 310 in FIG. 7. Each of the modules may be constructed in a manner similar to that shown in FIG. 1. In this way, an increased number of digits can be provided by combining the modules 304 and 306 to provide a single output from the two modules. For example, the interpolation line from the module 304 may be connected to the module 306 so that the module 304 corresponds to the current divider 200 and the switching network 202 in FIG. 3 and the module 306 corresponds to the current divider 210 and the switching network 212 in FIG. 3. Similar connections may be made to the modules 308 and 310 to increase the number of digits being converted to an analog value.

The provision of a plurality of modules on a single chip also offers other advantages. For example, if tests indicate that the module 308 is defective, the modules 304, 306 and 310 can still be used in combination to provide an enhanced digital significance. This module can be sold to a customer who is interested only in an accuracy represented by three (3) modules rather than four (4). In this way, a defective module does not necessarily mean a destruction of the chip but indicates only that the chip may have to be downgraded in the accuracy of its conversion of digital information to analog information.

Figure 8:
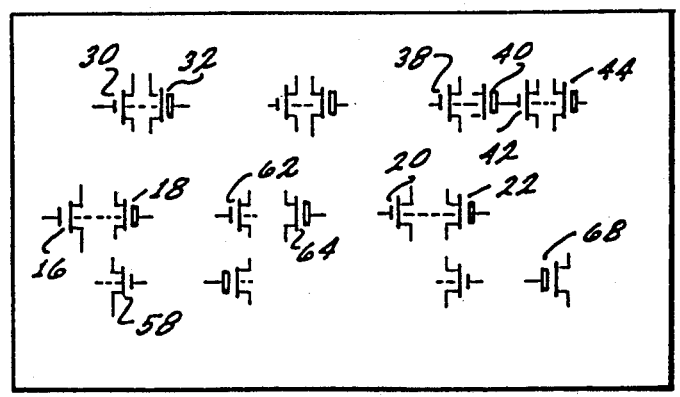
FIG. 8 is a schematic diagram showing the spaced disposition on an integrated circuit chip of different transistors shown in FIG. 1.

In order to increase the accuracy of the output current on the output line 51, the different transistors may be disposed in a spaced relationship such as shown in FIG. 8. For example, the transistors 16, 18, 20 and 22 in FIG. 1 may be considered to indicate the analog value of the binary signal on the input line 12. These transistors may be accordingly disposed at spaced positions on the chip. Similarly the transistors 30 through 44 (even numbers only) may be considered to indicate in analog form the value of the signal on the line 14. These transistors may accordingly be disposed in spaced relationship on the chip relative to each other and to the transistors 16, 18, 20 and 22.

By disposing in a spaced relationship the transistors representing each binary digit, any deviations in the characteristics of the chip at isolated positions on the chip can be averaged in the transistors of each group so that the accuracy of the output current on the line 51 is enhanced. It will be appreciated that the arrangement shown in FIG. 8 is only by way of example and that the disposition of the transistors may be provided in any suitably spaced relationship to obtain the desired averaging effect.

The converters shown in FIGS. 1, 3, 4 and 5 described above convert digital signals to an analog representation. These converters may also be used in a system such as shown in FIG. 11 to provide a conversation of analog information to a plurality of digital signals representing the analog information.

In the embodiment shown in FIG. 11, an analog signal is provided on a line 340. This analog signal is to be converted to digital form. This analog signal is compared in a comparator 342 with the analog signal on a line 344 which corresponds to the output line 51 in the converter shown in FIG. 1. The results of the comparison from the comparator 342 are introduced through a line 346 to a data processor such as a microprocessor 348. The microprocessor 348 processes the information represented by the signal on the line 346 and introduces signals to the input terminals of a digital-to-analog converter 350 corresponding to the converter shown in FIG. 1. The signals introduced to the digital-to-analog converter 350 cause the converter to provide an analog signal on the line 344 corresponding in characteristics to the analog signal on the line 340. When the analog signal on the line 344 corresponds in characteristics to the analog signal on the line 340, the output signals on lines 358 from the microprocessor constitute the digital signals which are introduced to the analog converter of FIGS. 1, 3 or 4 to obtain a conversion into a corresponding analog signal.

The capacitors such as the capacitors 82, 86, 90, 94, 98, 102, 106 and 110 in FIG. 1 may be formed as shown in FIG. 9. In the embodiment shown in FIG. 9, a first conductive sheet 400 is formed to provide a reference plane. This reference plane may be considered as the capacitor plate which is connected to the voltage source 114 in FIG. 1. The second plate of each capacitor may be formed in a conventional manner on a surface 400 in which all of the transistors are also formed. This second capacitor plate for each of the capacitors is schematically illustrated at 404 in FIG. 1.

It may sometimes be desired to provide capacitors of different values. This may be accomplished as shown in FIG. 10. In the embodiment shown in FIG. 9, a capacitance of a first value may be formed by providing on the surface 402 an area such as shown at 406. If it is desired to double the value of the capacitance, two areas 408 and 410, each of an area corresponding to the area 406, are provided as shown in FIG. 10. These areas are bridged as at 412. In this way, the value of individual ones of the capacitors can be varied on the integrated circuit chip during the design and layout of the chip.

The apparatus described above has certain important advantages in addition to the advantages described above. It provides a conversion between digital and analog values at a relatively fast rate, even with the use of capacitors as the output members, because the conversion results from the connection to an output line of capacitors each constituting a simple current source. The conversion is also accurate because the control of the output signal is obtained by the operation of a plurality of control switches which are connected in a particular matrix arrangement to be instantaneously responsive to the digital signals introduced to the matrix arrangement. The conversion is accurate and reliable, particularly when the converter is disposed on an integrated circuit chip. This results from the fact that the chip is quite small and the chip has substantially uniform characteristics throughout its surface area. For example, the chip may have a surface area less than one tenth inch (1/10") square to provide an accurate conversion of sixteen (16) binary bits. Furthermore, the accuracy of the conversion can be enhanced by disposing the control switches in each group in a spaced relationship throughout the surface area of the chip.

The converter of this invention also has other advantages of some importance. For example, the converter is monotonic. This results from the fact that the conversion to analog form of digital signals of progressively increasing value is obtained by connecting an increased number of output members such as capacitors to a particular output line, while maintaining the connection to the particular output line of capacitors previously connected to the line. Furthermore, by connecting output members such as capacitors to the particular output line to convert digital information to an analog form, errors resulting from differential and integral non-linearities are minimized. This is particularly true when the output members are precision capacitors and when there are a considerable number of capacitors in the converters.

The converters of this invention also have other advantages of some importance. For example, they introduce digital signals directly to a particular matrix arrangement without requiring that the digital signals be modified by decoders as in the prior art. Furthermore, the matrix arrangement is relatively simple and straightforward and operates to introduce current to an output line with a magnitude directly related to the analog value represented by the digital signals. The particular matrix arrangement is further advantageous because the paired relationship of the switches in the matrix arrangement causes substantially the same number of switches in the matrix relationship to be closed regardless of the digital value to be converted. Since substantially the same number of switches remains closed, the matrix arrangement has a balanced operation which contributes to the monoticity and integral and differential linearity of the converters of this invention. The balanced operation is enhanced because all of the output members are continuously conductive during the closure of the switch 132 in FIG. 1, whether they are connected to either one of the output lines such as the line 51 or the line 52 in FIG. 1.

There are other important advantages to the converter of this invention. For example, the converter of this invention is quite small. This is particularly true when the converters of this invention are compared with converters which attempt to provide a comparable accuracy and reliability in the prior art. The converters of this invention are also quite inexpensive. This results in part from the production of the converter on a single chip.

The converter of this invention also offers the advantage of providing controllable output currents. This results from the fact that the amount of power delivered at the output line, such as the line 51 in FIG. 1, can be adjusted by varying the number and size of the control switches in each stage in the matrix relationship. For example, the output current can be doubled by doubling the number of switches in each stage and the size of the capacitors controlling the output members. As a result of its ability to supply a controllable current, the converter of this invention can be considered to provide a current amplification at the same time that it provides a conversion. This is important in such applications as the conversion of aural information such as sound. The invention accordingly has a particular utility in the recently developed techniques of digital recording and reproduction of sound.

The apparatus of this invention is easily adaptable to provide for an addition of digits to increase it accuracy. This results in part from the modular construction of the apparatus such as shown in FIG. 3 and the repetitive nature of the matrix arrangement. This is particularly true when the apparatus is disposed on a chip such as shown in FIG. 6 or FIG. 7. The apparatus maintains its accuracy as it ages because the chip is essentially homogeneous in construction. As a result, all of the switches and capacitors on the chip age in substantially identical relationships. The disposition of the different switches in spaced relationship on the chip also facilitates an aging in which the accuracy is maintained.

The converter is also substantially free of the effects of temperature for substantially the same reasons as discussed above with respect to aging. This is particularly true when the output members constitute capacitors. Such avoidance in the chip of the effects of temperature variations also results from the fact that the distribution of the switches in each group throughout the surface area of the chip prevents the temperature of the chip from becoming excessive at any localized areas.

The converter of this invention also has another advantage of some significance. In the particular matrix relationship shown in FIG. 1, the width of the switches for each digit can be varied inversely to its numerical significance. For example, the switches 24 and 26 in FIG. 1 can be made wider than the switches 30, 32, 34 and 36. This increases the accuracy in the conversion between digital and analog values.

Although this invention application has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a conversion between a binary coded input word defined by a plurality of bits and an analog value,
   means for providing a plurality of binary coded input signals each corresponding to a particular bit in the binary coded input word,
   a plurality of switches each responsive, at the same time as the response of the other switches, only to a particular one of the binary coded input signals, the number of switches responsive to each particular binary coded input signal being dependent upon the binary value of such signal,
   a plurality of storage means each having a low value and each constructed to store energy in a short period of time,
   a line,
   means for connecting the switches to one another in an array having a repetitive pattern of switch connections to obtain the operation of the switches in a pattern dependent upon the binary coded input signals,
   means for connecting the switches, the storage means and the line to provide, for progressive increases in the binary coded input word, corresponding increases in the number of the storage means charging energy to the line in accordance with the pattern of operation of the switches, such pattern causing a particular sequence for charging energy through the storage means to the line in response to progressive increases in the binary coded input word, that particular sequence being the charging of energy through an additional one of the storage means to the line with each increase in the value of the binary coded input word while the storage means previously charging energy to the line continue to charge energy to the line, and
   means for providing for a discharge at particular times of energy from the storage means.

2. The combination set forth in claim 1 wherein
   the switches are paired to provide for the operation of only one switch in each pair at each instant and to provide for the selection of the switch in each pair for operation in accordance with the binary coded input signal introduced to such pair of switches and wherein the pattern of operation of the switches in the pairs controls the charge of energy through the storage means to the line and wherein the connecting means and the pattern of operation of the switches provide at each instant for the charge of energy to the line through a number of the storage means directly proportional to the analog value.

3. The combination set forth in claim 2 wherein
   the switches are disposed in the array electrically in sub-sets each having an individual binary value and each including a number of the switches directly proportional to the binary value of such sub-set.

4. The combination set forth in claim 1 wherein each of the switches is operative at each instant in the array to provide for the charge of energy from only an individual one of the storage means dependent upon the binary coded input value at such instant.

5. The combination set forth in claim 1, including,
   a second line, and
   means for connecting the switches, the storage means and the second line to provide, for progressive decreases in the binary coded input word, corresponding increases in the number of the storage means charging energy to the second line in accordance with the pattern of operation of the switches, such pattern causing a particular sequence for charging energy through the current means to the second line in response to progressive decreases in the binary coded input word, the particular sequence being the charge of energy through an additional one of the storage means to the second line with each increase in the value of the binary coded input word while the storage means previously charging energy to the second line continue to discharge energy to the second line.

6. The combination set forth in claim 1 wherein the storage means constitute capacitors.

7. In combination for providing a conversion between a binary coded input word defined by a plurality of bits and an analog value,
   means for providing a plurality of binary coded input signals each corresponding to a particular bit in the binary coded input word, the binary coded input signals occurring at the same time,
   a first sub-set of switches, each of the switches in the first sub-set being responsive only to a first individual one of the binary coded input signals,
   a second sub-set of switches, each of the switches in the second sub-set being responsive, at the same time as the response of the switches in the first sub-set, only to a second individual one of the binary coded input signals,
   a third sub-set of switches, each of the switches in the third sub-set being responsive, at the same time as the response of the switches in the first and second sub-sets, only to a third individual one of the binary coded input signals,
   a plurality of storage members each operative to store energy, means connected to the plurality of storage members to obtain the storage of energy in the storage members, the first, second and third individual ones of the signals representing binary bits of progressive binary significance, a line, means for connecting the switches in the first, second and third sub-sets in an array having a repetitive pattern of the switch connections to obtain an operation of the switches in a pattern dependent upon the binary coded input signals, means for connecting the switches, the storage means and the line to provide, for progressive increases in the binary coded input word, corresponding increases in the number of the storage means charging energy to the line in accordance with the pattern of operation of the switches, such pattern causing a particular sequence for charging energy through the storage means to the line in response to progressive increases in the binary coded input word, that particular sequence being the charging of energy through an additional one of the storage means to the line with each increase in the binary coded input word while the storage members previously charging energy to the line continue to discharge energy to the line, and means for discharging the energy in the storage members at particular times.

8. In a combination as set forth in claim 7, the switches in each of the first, second and third sub-sets being paired and having first and second states of operation, the switches in each pair in each of the first, second and third sub-sets providing for an operation of only one of the switches in each pair in the first state in response to the binary coded input signal.

9. In combination for providing a conversion between a binary coded input word defined by a plurality of bits and an analog value, means for providing a plurality of binary coded input signals each corresponding to a particular bit in the binary coded input word, a first sub-set of switches, each of the switches in the first sub-set being responsive only to a first individual one of the binary coded input signals, a second sub-set of switches, each of the switches in the second sub-set being responsive only to a second individual one of the binary coded input signals, a third sub-set of switches, each of the switches in the third sub-set being responsive only to a third individual one of the binary coded input signals, a plurality of storage members each operative to store energy, means connected to the plurality of storage members to obtain the storage of energy in the storage members, the first, second and third individual ones of the signals representing binary bits of progressive binary significance, a line, means for connecting the switches in the first, second and third sub-sets in an array having a repetitive pattern of the switch connections to obtain an operation of the switches in a pattern dependent upon the binary coded input signals, means for connecting the switches, the storage means and the line to provide, for progressive increases in the binary coded input word, corresponding increases in the number of the storage means charging energy to the line in accordance with the pattern of operation of the switches, such pattern causing a particular sequence for charging energy through the storage means to the line in response to progressive increases in the binary coded input word, that particular sequence being the charging of energy through an additional one of the storage means to the line with each increase in the binary coded input word while the storage members previously charging energy to the line continue to discharge energy to the line, and means for discharging the energy in the storage members at particular times, a second line, and means for connecting the switches in the first, second and third sub-sets to the storage members and the second line to provide, for progressive decreases in the binary coded input word, corresponding increases in the number of the storage members charging energy to the second line in accordance with the pattern of operation of the switches, such pattern causing a particular sequence for charging energy through the storage members to the second line in response to progressive decreases in the binary coded input word, that particular sequence being the charge of energy through an additional one of the storage members to the second line while the storage members previously charging energy to the second line continue to charge energy to the second line.

10. The combination set forth in claim 7, including, the storage members constituting capacitors, each of the switches having first and second states of operation and being operative in one of the first and second states in accordance with the value of the binary coded input signal to which it responds, the connecting means and the switches in the first, second and third sub-sets defining circuits providing for the charge of energy through each of the switches in the first state in the first, second and third sub-sets for each different value of the binary coded input word.

11. The combination set forth in claim 9, including, a third line, the third line being continuous electrically with the next one of the storage members to charge energy to the first line for increases in the binary coded input word and to charge energy to the second line for decreases in such binary coded input word.

12. The combination set forth in claim 11 wherein the connecting means for the switches in the first, second and third sub-sets and the switches in the first, second and third sub-sets providing, for each different value of the binary coded input word, for the charge of the same magnitude of energy through each of such switches operative in the first state.

13. The combination set forth in claim 11, including, at least an additional stage, the additional stage including:

fourth, fifth and sixth sub-sets of switches respectively corresponding to the first, second and third sub-sets of switches, a second plurality of storage members corresponding to the first plurality of storage members, fourth and fifth lines respectively corresponding to the first and second lines, means for connecting the switches in the fourth, fifth and sixth sub-sets in an array corresponding to the array provided by the connecting means for the switches in the first, second and third sub-sets, means of introducing to the switches in the fourth, fifth and sixth sub-sets binary coded input signals having a lower value in the binary coded input word than the binary coded input signals introduced to the first, second and third sub-sets, the first line being connected to the fourth line to provide for the charge of energy through individual ones of the second storage members to the first line in accordance with the operation of the switches in the second array, the second line being connected to the fifth line, and means connected to the first line to provide an indication of the analog value in accordance with the magnitude of the charge of energy through the first line.

14. In combination for providing a conversion between a binary coded input word defined by a plurality of bits and an analog value, means for providing a plurality of binary coded input signals each corresponding to a particular bit in the binary coded input word, sub-sets of switches, each of the sub-sets of switches being responsive only to an individual one of the binary coded input signals, the number of switches in each sub-set being dependent upon the binary value of the individual one of the binary coded input signals to which such sub-set responds, a plurality of charge members each operative to charge energy, a first line, means for connecting the sub-sets of switches in an array having a repetitive pattern of switch connections to obtain the operation of the switches in a pattern dependent upon the binary coded input signals, and means for connecting the switches, the storage members and the line to provide, for progressive increases in the binary coded input word, corresponding increases in the number of the storage members charging energy to the line in accordance with the pattern of operation of the switches, such pattern causing a particular sequency for charging energy through the storage members to the line in response to progressive increases in the binary coded input word, that particular sequence being the charge of energy through an additional one of the storage members to the line with each increase in the binary coded input word while the storage members previously charging energy to the line continue to charge energy to the line, additional means responsive to the binary coded input signals of lower binary value than the value of the binary coded input signals introduced to the sub-sets of the switches, an interpolation line responsive to the charge of energy at each instant through the next one of the storage members to charge such energy to the first line with each increase in the binary value of the binary coded input signals, means for connecting the interpolation line and the additional means to provide a charge of the energy through the interpolation line to the additional means in accordance with the value of the binary coded input signals introduced to the additional means, and means for connecting the additional means to the first line to obtain to the first line a charge of energy having a magnitude representing the analog value.

15. The combination set forth in claim 14, including, the additional means including additional sub-sets of switches, a second plurality of storage members and second connecting means respectively providing the same connections to the switches in the additional sub-sets as the connections of the first connecting means to the switches in the first sub-sets, the switches in the first and additional sub-sets being simultaneously responsive to the individual ones of the binary coded input signals.

16. The combination set forth in claim 14, including, a third line, and means for connecting the switches, the storage members, and the third line to provide, for progressive decreases in the binary coded input word, corresponding increases in the number of the storage members charging energy to the third line in accordance with the pattern of operation of the switches, such pattern causing a particular sequence for charging energy through the storage members to the third line in response to progressive decreases in the binary coded input word, that particular sequence being the charge of energy through an additional one of the storage means to the third line with each increase in the value of the binary coded input word while the storage means previously charging energy to the third line continue to charge energy to the third line.

17. The combination set forth in claim 14, including, each of the switches being connected in the repetitive array to charge the same magnitude of energy through each of the switches, regardless of the value of the binary coded input word, when the switches are operative to provide for the charging of energy.

18. The combination set forth in claim 16, including, the switches in each sub-set being paired to provide for an operation of only one of the switches in each pair in response to the individual one of the binary coded input signals to which the switches respond.

19. In a combination as set forth in claim 14, the storage members constituting capacitors.

20. In a combination as set forth in claim 18, the storage members constituting capacitors.

21. In combination for use with binary coded input signals for converting a binary coded input word defined by bits into an analog value, each of the binary coded input signals corresponding to a particular bit in the binary coded input word, a first pair of switches each responsive only to one of the binary coded input signals of first binary value, each of the switches in the first pair having first, second and third terminals, second and third pairs of switches each responsive only to the binary coded input signal of next highest binary value relative to the first binary value, each of the switches in the second and third pairs having first, second and third terminals respectively corresponding to the first, second and third terminals in the switches of the first pair, the first terminals in the switches of the first pair being connected to the second terminals of a particular one of the switches in each of the second and third pairs, first and second lines, the second terminal of the other switch in the second pair being connected to the first line, the second terminal of the switch in the third pair being connected to the second line, means for introducing the binary coded input signal of the low value to the third terminals of the switches in the first pair to obtain an operation of the switches in the first pair only in accordance with such low value, means for introducing the binary coded input signal of the next highest binary value to the third terminals of the switches in the second and third pairs to obtain an operation of such switches in the second and third pairs only in accordance with such next highest value, a plurality of storage members, each of the storage members being operative to charge energy, the first terminals of the switches in the second pair being coupled to a first one of the storage members and the first terminals of the switches in the third pair being coupled to a second one of the storage members, and means coupled to the storage members to produce a charge of energy through each of the storage members and through the switches in the first state in the first, second and third pairs to individual ones of the first and second lines and the interpolation line dependent upon the patterns of operation of the switches in the first, second and third pairs in the first and second states, and means for discharging the energy in the storage members at particular times.

22. The combination set forth in claim 21, including, an interpolation line, the second terminal of one of the switches in the first pair being connected to the first line and the second terminal of the other one of the switches in the first pair being connected to the interpolation line.

23. In a combination as set forth in claim 21, the storage members constituting capacitors.

24. In combination for converting between a binary coded input word defined by a plurality of bits and an analog value, means for providing a plurality of binary coded input signals each corresponding to a particular bit in the binary coded input word, a plurality of switches each responsive only to an individual one of the binary coded input signals, means for connecting the switches in an array having a repetitive pattern of switch connections to obtain the operation of the switches in a pattern dependent upon the binary coded input signals, first and second sub-sets of the switches, each of the switches in the first and second sub-sets having first, second and third terminals, the first terminals of the switches in the first sub-set being connected to the second terminals of first switches in the second sub-set and to the third terminals of second switches in the second sub-set, the switches in the second sub-set having the next highest binary value to the switches in the first sub-set, first and second lines, the third terminals of the switches in the second sub-set being connected to the first line, and the second terminals of the switches in the second sub-set being connected to the second line, a third line, the second terminals of the switches in the first sub-set being connected to the third line, a plurality of storage members, each of the first terminals of the switches in the second sub-set being connected to an individual one of the storage members, and means for providing for a charge of energy through the third line and a particular one of the storage members, the particular one of the storage members being the next to charge energy to the first line for increases in the binary coded input word and to charge energy to the second line for decreases in such binary coded input word, and means for discharging the energy in the storage members at particular times.

25. In a combination as set forth in claim 24, the storage members constituting capacitors.

26. In combination for converting between a binary coded input word defined by a plurality of bits and an analog value, means for providing a plurality of binary coded input signals each corresponding to a particular bit in the binary coded input word, a plurality of switches connected in an array defined by sub-sets, the switches in each sub-set being responsive only to a particular one of the binary coded input signals, the number of the switches in each sub-set being dependent upon the binary value of the binary coded input signal to which the switches in the sub-set respond, the array being defined by repetitions of a particular sub-relationship, each such repetition being defined by a particular number of the switches in one of the sub-sets of a first binary value and a different number of the switches in the sub-set of the next highest binary value, such different number being dependent upon the next highest binary value relative to the first binary value, and each such repetition being further defined by a particular pattern of interconnections between the switches of the first binary value and the switches of the next highest binary value, a plurality of storage means each operative to charge energy, means for discharging the storage means at particular times, a line, and means for connecting the switches, the storage means and the line to provide, for progressive increases in the binary coded input word, corresponding increases in the number of the storage means charging energy to the line in accordance with the pattern of the operation of the switches, such pattern causing a particular sequence for charging energy through the storage means to the line in response to progressive increases in the binary coded input word, that particular sequence being the charging of energy through an additional one of the storage means to the line while the storage means previously charging energy to the line continue to charge energy to the line.

27. The combination set forth in claim 26 including:
each of the switches being connected in the repetitive array to charge energy in only one of the storage means regardless of the value of the binary coded input word.

28. The combination set forth in claim 26 including:
a second line, and
means for connecting the switches, the storage means and the second line to provide, for progressive decreases in the binary coded input word, corresponding increases in the number of the storage means charging energy to the second line in accordance with the pattern of operation of the switches, such pattern causing a particular sequence for charging energy through the storage means to the second line in response to particular decreases in the binary coded input word, the particular sequence being the storage of energy through an additional one of the storage means to the second line while the storage means previously charging energy to the second line continue to charge energy to the second line.

29. The combination set forth in claim 28, including,
a third line, and
means for connecting the switches, the storage means and the third line to provide for the charging of energy through a particular one of the storage means to the third line, the particular one of the storage means being the next one to charge energy to the first line for a progressive increase in the binary coded input word and to charge energy to the second line for a progressive decrease in the binary coded input word.

30. The combination set forth in claim 26, including,
each sub-set having twice as great a binary value as the sub-set of the next least binary value and having twice as great a number of switches as the number of the switches in the sub-set of the next least binary value.

31. The combination set forth in claim 24 wherein
the number of the switches in the second sub-set is twice as great as the number of the switches in the first sub-set and the binary value of the second sub-set is twice as great as the binary value of the first sub-set.

32. The combination as set forth in claim 26 wherein
each of the switches is connected in the repetitive array to provide for the charging of the same magnitude of energy to the line as the magnitude of the charge of energy provided through the other switches in the array.

* * * * *